United States Patent
Noma et al.

(10) Patent No.: US 9,354,408 B2
(45) Date of Patent: May 31, 2016

(54) VIA FOR ELECTRICAL CONTACT PASSING THROUGH LAYERS OF OPTICAL WAVEGUIDE IN MULTILAYER STRUCTURE INCLUDING ELECTRICAL SUBSTRATE AND LAMINATED LAYERS OF OPTICAL WAVEGUIDE

(71) Applicant: International Business Machines Corporation, Armonk, NY (US)

(72) Inventors: Hirokazu Noma, Tokyo (JP); Keishi Okamoto, Tokyo (JP); Masao Tokunari, Tokyo (JP); Kazushige Toriyama, Tokyo (JP); Yutaka Tsukada, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/646,856

(22) PCT Filed: Oct. 17, 2013

(86) PCT No.: PCT/JP2013/078242
§ 371 (c)(1),
(2) Date: May 22, 2015

(87) PCT Pub. No.: WO2014/080709
PCT Pub. Date: May 30, 2014

(65) Prior Publication Data
US 2015/0338589 A1 Nov. 26, 2015

(30) Foreign Application Priority Data
Nov. 22, 2012 (JP) .................................. 2012-256626

(51) Int. Cl.
*H01L 21/00* (2006.01)
*G02B 6/42* (2006.01)
(Continued)

(52) U.S. Cl.
CPC .............. *G02B 6/4274* (2013.01); *G02B 6/122* (2013.01); *G02B 6/132* (2013.01); *G02B 6/428* (2013.01);
(Continued)

(58) Field of Classification Search
None
See application file for complete search history.

(56) References Cited

U.S. PATENT DOCUMENTS

| | | |
|---|---|---|
| 2008/0235532 A1 | 9/2008 | Pomerantz |
| 2009/0245720 A1 | 10/2009 | Choki et al. |
| 2010/0226606 A1 | 9/2010 | Choki et al. |
| 2010/0323297 A1* | 12/2010 | Yanagisawa ............ G02B 6/43 430/315 |

FOREIGN PATENT DOCUMENTS

| | | |
|---|---|---|
| EP | 2 023 171 A1 | 2/2009 |
| JP | 6-167622 A | 6/1994 |

(Continued)

OTHER PUBLICATIONS

International Search Report PCT/JP2013/078242.

*Primary Examiner* — Seahvosh Nikmanesh
(74) *Attorney, Agent, or Firm* — Scully, Scott, Murphy & Presser, P.C.; Keivan Razav, Esq.

(57) ABSTRACT

A structure is formed which is prepared as a via for electrical contact passing through layers of an optical waveguide, in a multilayer structure including an electrical substrate and the laminated layers of the optical waveguide. The surface of an electrode pad is plated with solder. The layers of the optical waveguide are formed above the portion plated with solder are removed to expose the portion plated with solder. A device is prepared having both a light-emitter or photoreceptor in optical contact with the optical waveguide, and a stud (pillar). The stud (pillar) is inserted into the portion in which layers of the optical waveguide have been removed, and the plated solder is melted to bond the electrode pad on top of the electrical substrate to the tip of the inserted stud (pillar).

5 Claims, 7 Drawing Sheets

(51) Int. Cl.
*G02B 6/132* (2006.01)
*G02B 6/122* (2006.01)
*H05K 1/02* (2006.01)
*H05K 3/34* (2006.01)
*G02B 6/136* (2006.01)
*G02B 6/43* (2006.01)

(52) U.S. Cl.
CPC ............ *G02B 6/4214* (2013.01); *H05K 1/0274* (2013.01); *H05K 3/3473* (2013.01); *G02B 6/136* (2013.01); *G02B 6/43* (2013.01); *H05K 2201/10121* (2013.01)

(56) References Cited

FOREIGN PATENT DOCUMENTS

| | | |
|---|---|---|
| JP | 07-159658 A | 6/1995 |
| JP | 2001-196643 A | 7/2001 |
| JP | 2002-174744 A | 6/2002 |
| JP | 2003-161853 A | 6/2003 |
| JP | 2005-84126 A | 3/2005 |
| JP | 2005-195651 A | 7/2005 |
| JP | 2008-281816 A | 11/2008 |
| JP | 2009-180861 A | 8/2009 |
| JP | 4523970 | 8/2010 |
| WO | WO 2007/139155 A1 | 6/2007 |

\* cited by examiner

Continued in FIG. 2

FIG. 2
Continued From FIG. 1
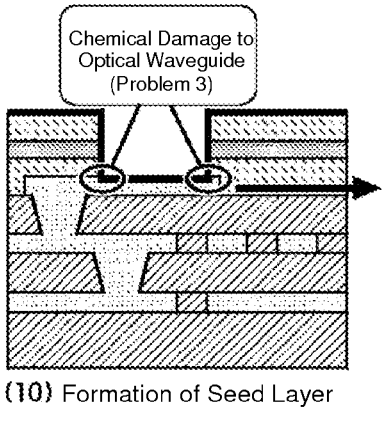
(10) Formation of Seed Layer
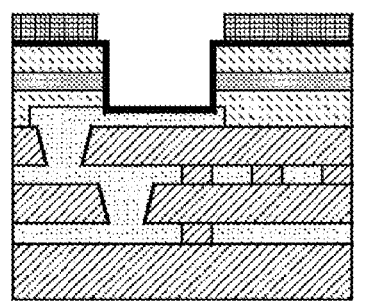
(11) Formation of Resist Pattern
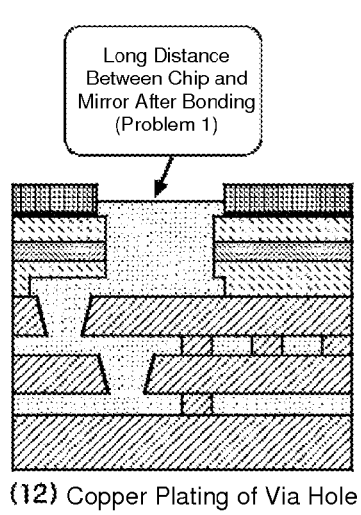
(12) Copper Plating of Via Hole
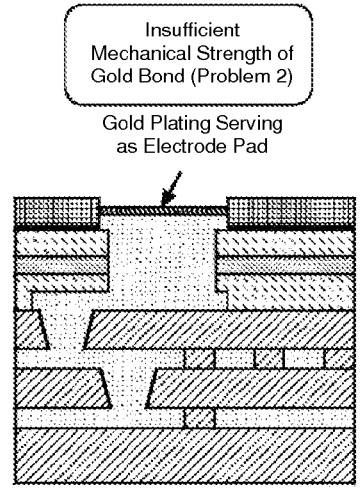
(13) Gold Plating of Surface
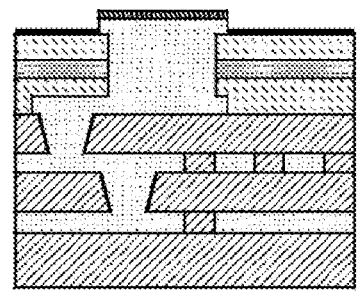
(14) Strip of Resist
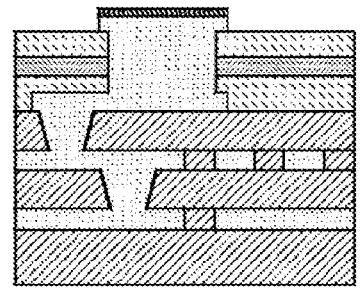
(15) Removal of Seed Layer
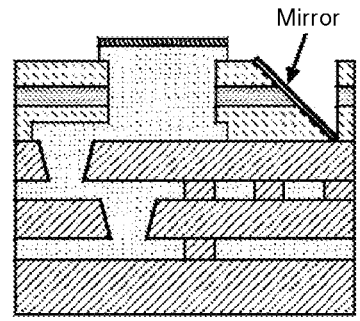
(16) Formation of Mirror
Prior Art Prior Art

- Characteristics of Steps (7)-(12) in Present Invention
- Process Can Be Shortened (1) Formation of Insulating Layer Steps (1)-(6) can be the same as those in the prior art (FIG. 1 and FIG. 2)

(6) Strip of Resist (8) Formation of Solder on Pad: Metal Plating Formed to Any Thickness (7) Formation of Resist pattern (9) Strip of Resist Present Invention

(10) Removal of Seed Layer

Continued in FIG. 5

FIG. 5
Continued From FIG. 4
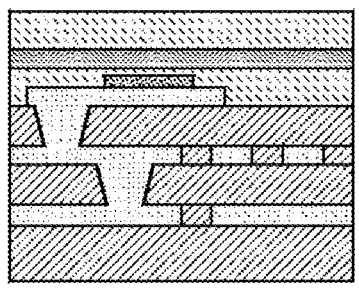
(11) Formation of Optical Waveguide
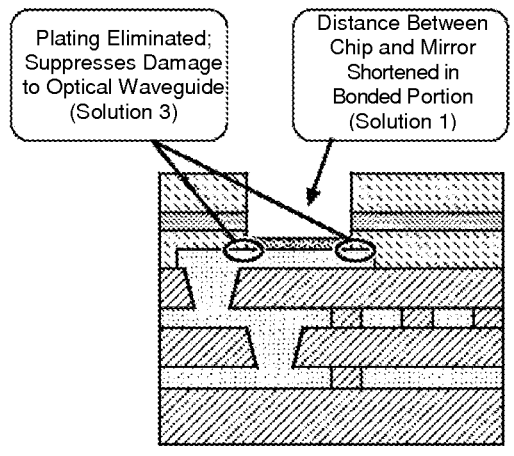
Plating Eliminated; Suppresses Damage to Optical Waveguide (Solution 3)
Distance Between Chip and Mirror Shortened in Bonded Portion (Solution 1)
(12) Formation of Via Hole
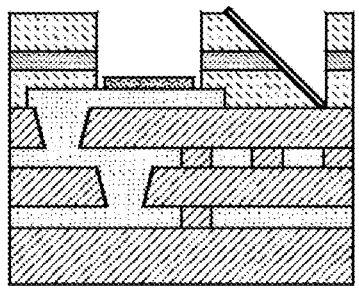
(13) Formation of Mirror
Present Invention Structure of the Present Invention Improvement in Insertion Loss Present Invention

- Solder plating (100% Sn here) was formed over the surface of the pad on the electrical substrate, and gold studs (bumps) were mounted on top to obtain a good metal bonding. The resistance per bump was dozens of mΩ.
- When gold bonding was performed, the resistance per bump was several Ω.

VIA FOR ELECTRICAL CONTACT PASSING THROUGH LAYERS OF OPTICAL WAVEGUIDE IN MULTILAYER STRUCTURE INCLUDING ELECTRICAL SUBSTRATE AND LAMINATED LAYERS OF OPTICAL WAVEGUIDE

CROSS-REFERENCE TO RELATED APPLICATIONS

This application is based on and claims the benefit of priority from commonly-owned, co-pending on PCT Application No. PCT/IB2013/078242 filed Oct. 17, 2013, which further claims the benefit of priority from commonly-owned Japanese Patent Application 2012-256626, filed on Nov. 22, 2012.

TECHNICAL FIELD

The present invention relates to a multilayer structure including an electrical substrate and the laminated layers of an optical waveguide.

The present invention relates more specifically to a technique for forming a structure which is prepared as a via for electrical contact passing through the layers of an optical waveguide.

BACKGROUND ART

Multilayer structures have been developed and devised which include an electrical substrate and laminated layers of an optical waveguide.

A device or optical chip including a light-emitter (VCSEL, etc.) or photoreceptor (PD, etc.), which operates in optical contact with an optical waveguide, requires electrical contact with an electrical substrate to operate electrically.

A via for electrical contact passing through the layers of the optical waveguide is known to be used for this purpose.

FIG. 1 and FIG. 2 are diagrams used to explain the formation of a via for electrical contact in the prior art.

Note that FIG. 1 and FIG. 2 are consecutive.

In order to establish an electrical substrate combining an insulating layer and a conductive layer, an insulating layer and copper wiring are formed as shown in (1).

In the prior art, a via hole is formed by removing a portion of the insulating layer as shown in (2).

In the prior art, pre-treatment is performed and a seed layer is formed as shown in (3).

In the prior art, a resist pattern is formed as shown in (4).

In the prior art, copper wire is formed which fills the formed via hole as shown in (5).

Wiring formed to reach a different layer in this way is called a "via", more specifically, a "filled via".

In the prior art, the resist pattern is stripped as shown in (6).

In the prior art, the seed layer is etched as shown in (7).

The rest of the process involves the formation of a multilayer structure including the electrical substrate and the laminated layers of the optical waveguide.

In the prior art, the layers of the optical waveguide are formed as shown in (8).

A core is surrounded by an underclad and an overclad so that light propagates through the core.

The core and the clads have different refractive indices.

In the prior art, some of the layers of the optical waveguide are removed to form a via hole.

In the prior art, pre-treatment is performed and a seed layer is formed as shown in (10).

The seed layer is formed so that electricity is supplied to the portion requiring plating when copper plating is performed later.

The seed layer is generally formed using electroless plating. At this time, the electroless plating solution penetrates into the gaps between the copper wiring and underclad.

Because the materials in the optical waveguide have poor chemical resistance, the processing time using chemical products has been intentionally shortened.

Such a process should be eliminated if possible.

In the prior art, a resist pattern is formed as shown in (11).

In the prior art, copper plating is performed on the via hole, and copper wiring filling the via hole is formed as shown in (12).

Here, a filled via is formed, but this causes the distance between the chip and mirror to be lengthy after bonding. This problem is explained in greater detail below.

In the prior art, gold plating is formed on the upper surface of the filled via as shown in (13).

This is used as an electrode pad.

Gold has superior characteristics such as corrosion resistance and good electrical contact, but the mechanical strength of gold bonding is insufficient. This problem is explained in greater detail below.

In the prior art, the resist pattern is stripped as shown in (14).

In the prior art, the seed layer is etched as shown in (15).

Finally, in the prior art, a portion of the layers of the optical waveguide are removed to install a mirror as shown in (16).

Typically, optical contact is established with a light-emitter (VCSEL, etc.) emitting light on a plane or a photoreceptor (PD, etc.) receiving light on a plane by converting the direction of light to 45 degrees.

FIG. 3 is a diagram showing the configuration of the electrical contact between the device or optical chip and the electrical substrate in the prior art.

The device or chip has a stud (pillar), and the stud (pillar) is bonded to the gold plating on top of the electrical substrate serving as an electrode pad.

A bond with the gold is formed by applying pressure and squashing the gold. However, because the cross-sectional area of contact is limited, the mechanical strength is insufficient.

The cross-sectional area of contact also affects the electrical resistance of the current flowing through.

In addition, a long portion of the stud (pillar) remains in place, and this lengthens the distance between the chip and the mirror after bonding.

Because a long distance between the chip and mirror is linked to insertion loss, this distance should be as short as possible.

When there is a direction conversion error (for example, 45°±α°), a longer distance makes it more difficult to position the light-emitter or photoreceptor.

Patent Literature 1, Patent Literature 2 and Patent Literature 3 all address the technical problem of reducing insertion loss by bringing the chip and mirror closer together by forming a via in a region of the optical waveguide.

However, none of them mentions one of the characteristics of the present invention, which is to form a via by removing a portion of the optical waveguide.

Patent Literature 4, Patent Literature 5 and Patent Literature 6 describe the mounting of an optical chip, but none of them disclose or suggest the important point mentioned above.

Patent Literature 1-6 is listed below.

CITATION LIST

Patent Literature

Patent Literature 1 U.S. Pat. No. 4,523,970 (PCT No. WO2006/012195, Japanese Patent Publication No. 2008-500591)
Patent Literature 2 Laid-open Patent Publication No. 2008-281816
Patent Literature 3 Laid-open Patent Publication No. 7-159658
Patent Literature 4 U.S. Pat. No. 3,731,542 (Laid-open Patent Publication No. 2003-215371)
Patent Literature 5 Laid-open Patent Publication No. 2009-180861
Patent Literature 6 Laid-open Patent Publication No. 2005-195651

SUMMARY OF INVENTION

Technical Problems

The object of the present invention is to solve the problems associated with the prior art (the long distance between the chip and mirror after bonding, the insufficient strength of the gold bond, and chemical damage to the optical waveguide).

Solution to Problems

The characteristics of the method are to prepare a resist pattern over the electrode pad on top of the electrical substrate, plating the surface of the electrode pad with solder according to the resist pattern, removing the resist pattern, forming the layers of the optical waveguide to cover the portion plated with solder, removing the layers of the optical waveguide on top of the portion plated with solder, and exposing the portion plated with solder.

The characteristics of the structure are to form solder plating on the surface of the electrode pad on top of the electrical substrate, forming the layers of the optical waveguide to cover the top of the electrical substrate, and then removing the layers of the optical waveguide on top of the portion plated with solder to expose the portion plated with solder.

Effect of the Invention

The present invention is able to solve the problems associated with the prior art (by reducing the distance between the chip and mirror after bonding, providing a strong metal bond using solder, and eliminating plating to suppress damage to the optical waveguide).

BRIEF DESCRIPTION OF DRAWINGS

FIG. 2 is a diagram used to explain the formation of a via for electrical contact in the prior art. (Note that FIG. 1 and FIG. 2 are consecutive.)
FIG. 5 is a diagram used to explain the formation of a via for electrical contact in the present invention. (Note that FIG. 4 and FIG. 5 are consecutive.)

DESCRIPTION OF EMBODIMENT

Figure 4:
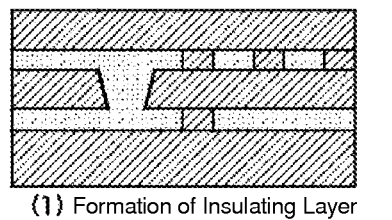
FIG. 4 is a diagram used to explain the formation of a via for electrical contact in the present invention. (Note that FIG. 4 and FIG. 5 are consecutive.)
Figure 4:
Figure 4:
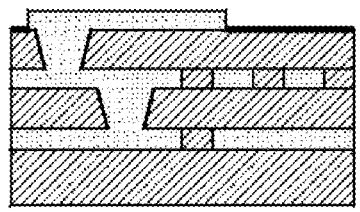
Figure 4:
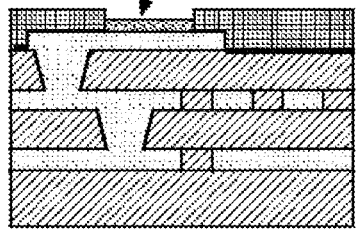
Figure 4:
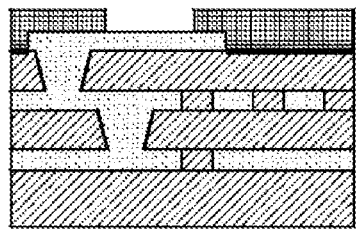
Figure 4:
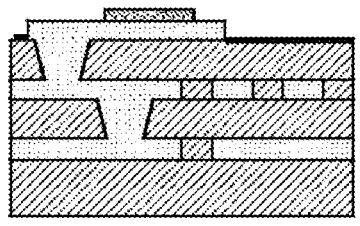
Figure 4:
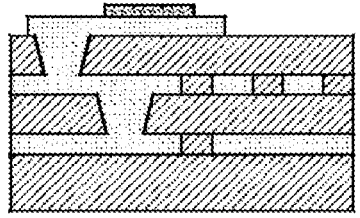
Figure 4:

FIG. 4 and FIG. 5 are diagrams used to explain the formation of a via for electrical contact in the present invention.

Note that FIG. 4 and FIG. 5 are consecutive.

Figure 1:
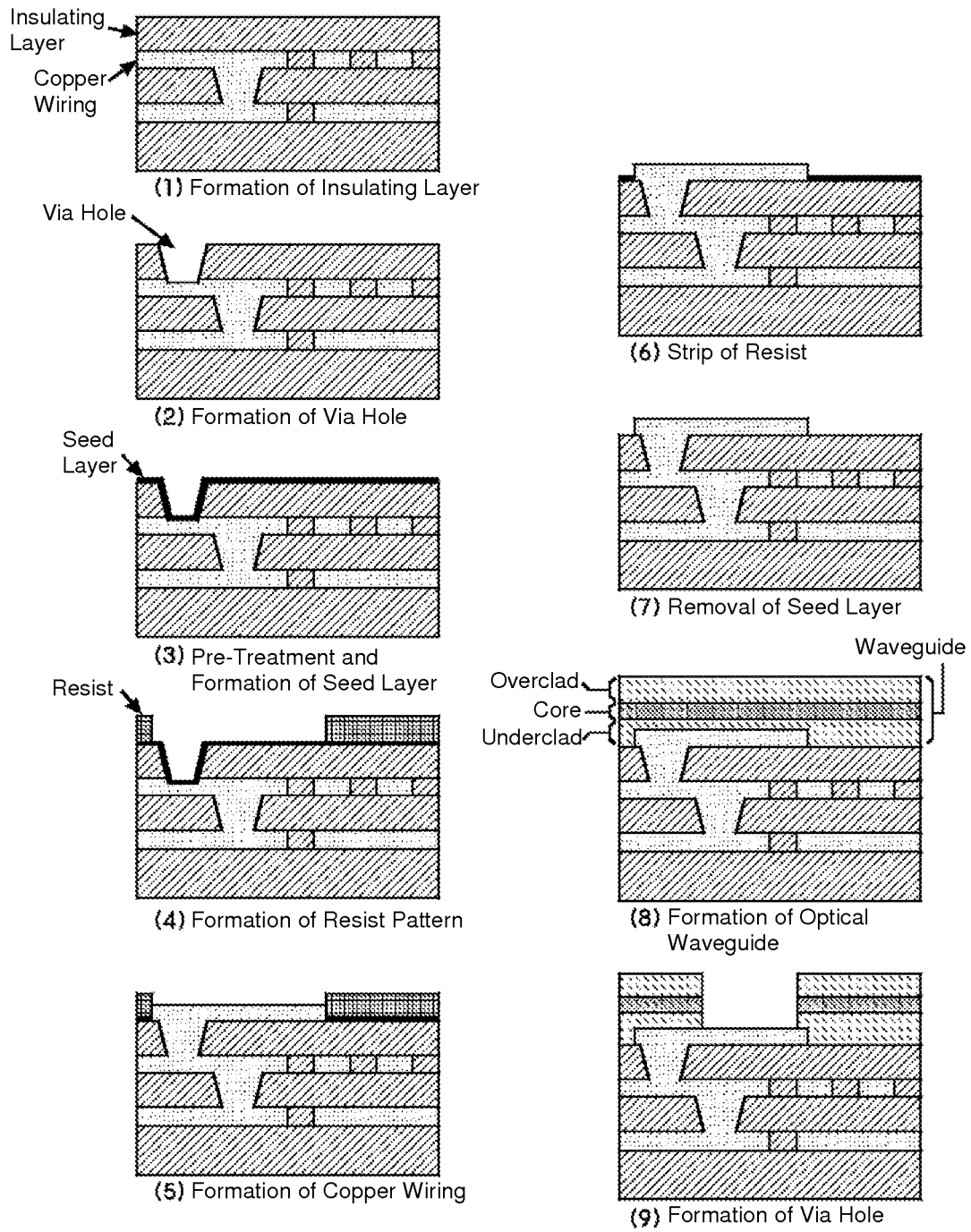
FIG. 1 is a diagram used to explain the formation of a via for electrical contact in the prior art. (Note that FIG. 1 and FIG. 2 are consecutive.)
Figure 3:
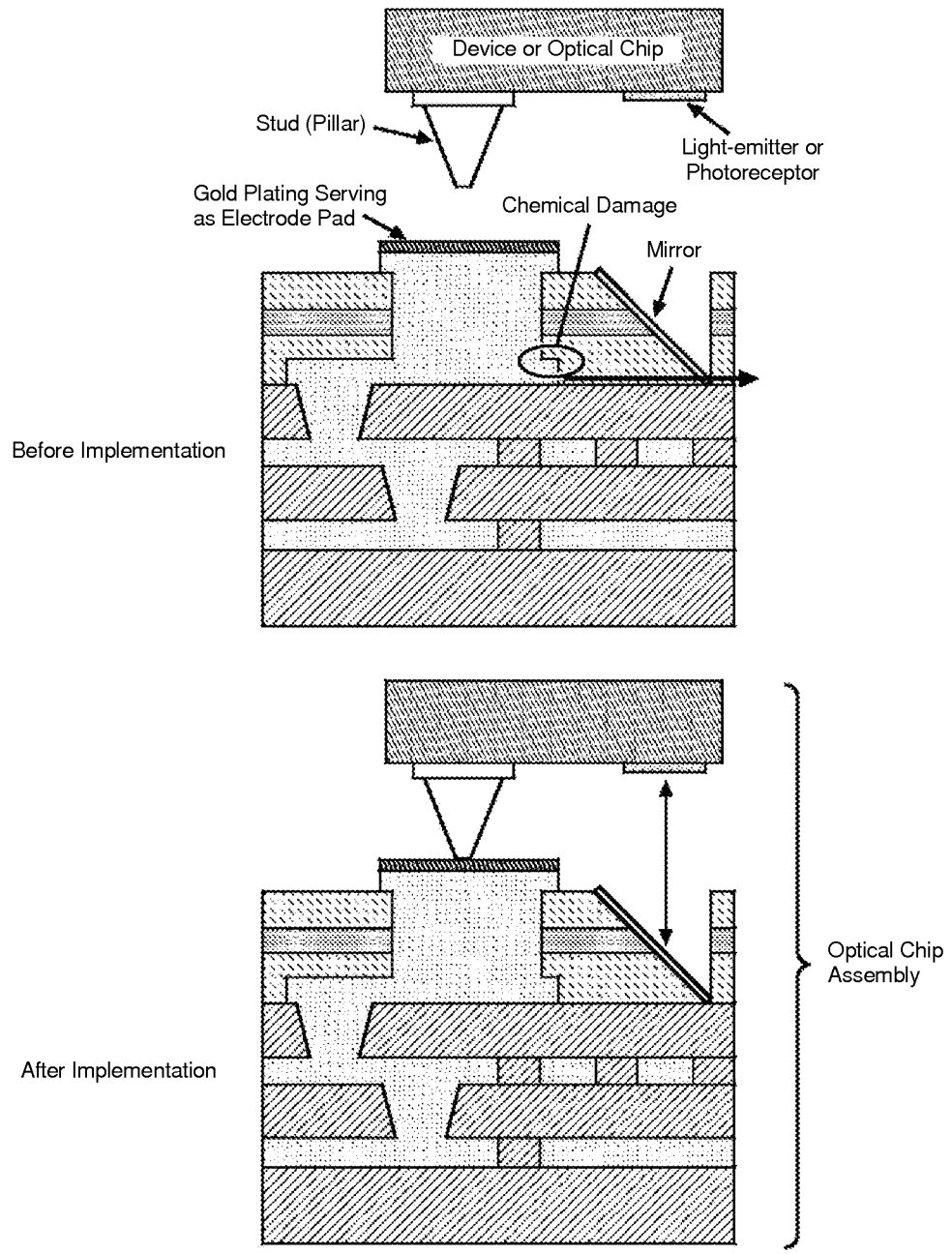
FIG. 3 is a diagram showing the configuration of the electrical contact between the device or optical chip and the electrical substrate in the prior art.

Steps (1) through (6) can be the same as those in the prior art (FIG. 1 and FIG. 2).

Therefore, to avoid redundancy, further explanation has been omitted.

In the present invention, as shown in (7), a resist pattern is formed.

In other words, a resist pattern is prepared over the electrode pad on top of the electrical substrate.

In the present invention, as shown in (8), solder is formed on top of the electrode pad.

In other words, solder is plated on the surface of the electrode pad in accordance with the resist pattern.

The solder can be adjusted to any thickness using electroplating. The layer can be thin or thick.

In this way, strong metal bonding can be obtained using solder.

In the present invention, as shown in (9), the resist is stripped.

In other words, the prepared resist pattern is removed.

In the present invention, as shown in (10), the seed layer is etched.

The rest of the process involves the formation of a multilayer structure including the electrical substrate and the laminated layers of the optical waveguide.

In the present invention, as shown in (11), the layers of the optical waveguide are formed.

In other words, the layers of the optical waveguide are formed on top of the electrical substrate, covering the portion plated with solder.

In the present invention, as shown in (12), a portion of the layers of the optical waveguide is removed, and a via hole is formed.

In other words, the layers of the optical waveguide over the portion plated with solder are removed to expose the portions plated with solder.

The seed layer formation and plating steps in the prior art are eliminated.

There is, of course, no chemical damage to the optical waveguide.

Instead of the "filled via" of the prior art, a so-called "conformal via" is formed in the present invention.

Because the space inside the conformal via can be utilized, the distance between the chip and the mirror after bonding can be reduced as described below.

Finally, in the present invention, as shown in (13), a portion of the layers of the optical waveguide is removed, and a mirror is installed.

Figure 6:
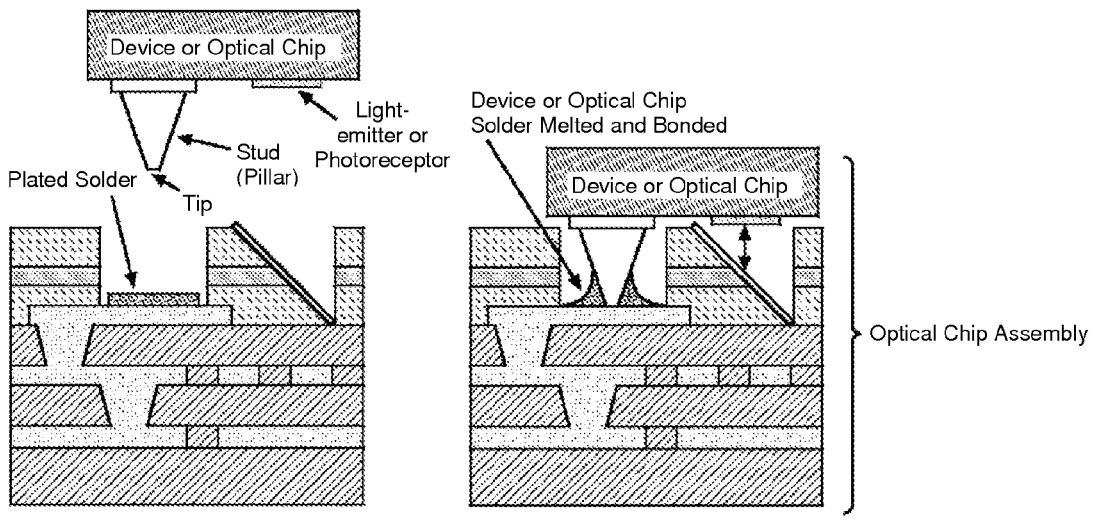
FIG. 6 is a diagram showing the configuration of the electrical contact between the device or optical chip and the electrical substrate in the present invention.
Figure 6:
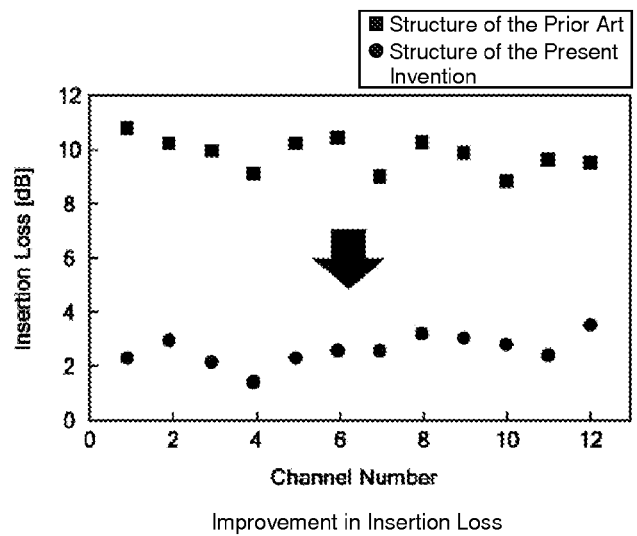

FIG. 6 is a diagram showing the configuration of the electrical contact between the device or optical chip and the electrical substrate in the present invention.

The device or optical chip has a stud (pillar), and the stud (pillar) is bonded to the solder plated on the surface of the electrode pad on top of the electrical substrate.

The stud (pillar) may be inserted into the portion in which the layers of the optical waveguide have been removed, and the plated solder melted to bond the electrode pad on the electrical substrate to the tip of the inserted stud (pillar).

Here, a strong metal bond using solder has been realized in a specific structure.

The space in the conformal via can be utilized to accommodate the stud (pillar) and significantly reduce the distance between the chip and mirror after bonding.

In order to realize this structure, the device may be provided with both a light-emitter or photoreceptor in optical contact with the optical waveguide, and a stud (pillar) long enough to reach the electrode plated with solder on top of the electrical substrate.

In other words, the floor of the conformal via is utilized.

For such a purpose, the shape and other characteristics of the "stud (pillar)" can be broadly interpreted by those skilled in the art to include many different modifications and applications.

The thickness of the plated solder can be adapted with respect to the thickness of the layers of the formed optical waveguide and the length (height) of the prepared stud (pillar).

The conformal via may conceivably be filled with solder by filling the conformal via with solder paste to a thickness close to that of a filled via.

However, when bonding is performed using molten solder, there is a risk that the solder will overflow (due to thermal expansion, etc.) and cause a short.

Also, it is not easy to supply the appropriate amount of solder paste to the via.

Therefore, the use of plating is superior.

The layers of the optical waveguide may be formed by laminating a laminated waveguide (having a core interposed between an underclad layer and an overclad layer) on top of the electrical substrate.

Also, the laminated optical waveguide may be configured so the layers of the optical waveguide above the portion plated with solder are removed beforehand, and the portion plated with solder remains exposed during lamination.

The use of a laminated optical waveguide can reduce steps (11) and (12) in the present invention to a single step and shorten the process.

Laminated optical waveguides are available which are thinner than laminating an underclad, then a core, and then an overclad which are a photocurable resin (etc.).

When a thin laminated optical waveguide is used, the solder plating can also be thinner.

When a photocurable resin is laminated, the solder plating can be thicker.

When solder is melted and bonded, the solder may flow once it melts into the form shown in the diagram due to surface tension.

This alone can cause one to say the structure of the present invention is itself novel.

It is clear from the plot distribution in the graph that the improvement to insertion loss is good.

Figure 7:
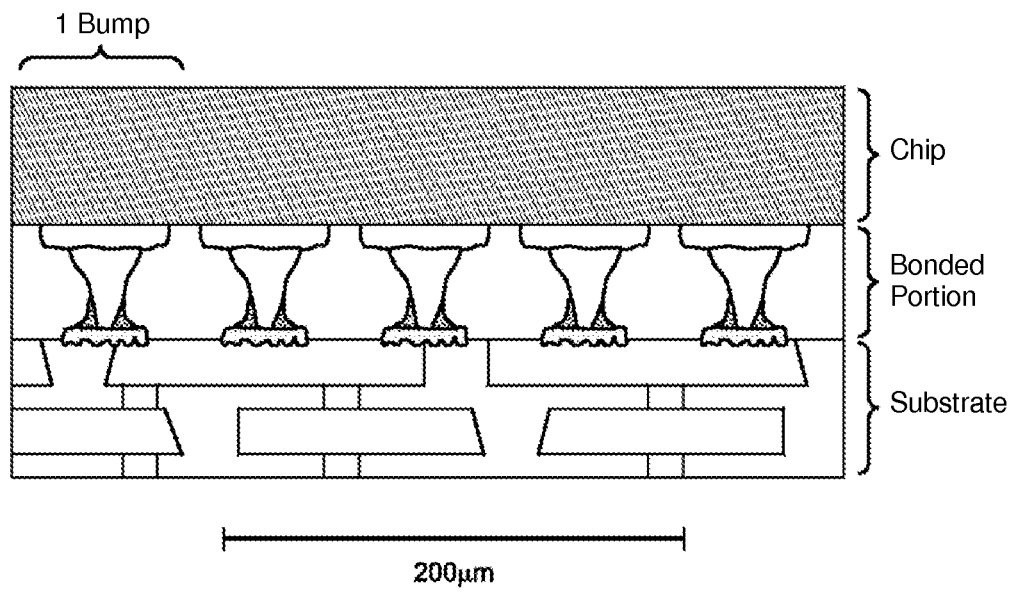
FIG. 7 is a diagram showing the results of an experiment conducted on the present invention.

FIG. 7 is a diagram showing the results of an experiment conducted on the present invention.

Solder plating (100% Sn here) was formed over the surface of the electrode pad on top of the electrical substrate, and gold studs (bumps) were mounted on top to obtain a good metal bond.

The resistance per bump was dozens of mΩ.

When gold bonding was performed, the resistance per bump was several Ω.

The invention claimed is:

1. A method of forming a structure prepared as a via for electrical contact passing through layers of an optical waveguide in a multilayer structure including an electrical substrate and the laminated layers of the optical waveguide, the method comprising the steps of:
   preparing a resist pattern above an electrode pad on top of the electrical substrate;
   plating the surface of the electrode pad with solder in accordance with the resist pattern;
   removing the prepared resist pattern;
   forming the layers of the optical waveguide on top of the electrical substrate, covering the portion plated with solder; and
   removing the layers of the optical waveguide above the portion plated with solder, exposing the portion plated with solder.

2. The method according to claim 1 further comprising the steps of:
   preparing a device having both a light-emitter or photoreceptor in optical contact with the optical waveguide, and a stud (pillar) long enough to reach the electrode plated with solder on top of the electrical substrate;
   inserting the stud (pillar) into the portion in which layers of the optical waveguide have been removed; and
   melting the plated solder to bond the electrode pad on top of the electrical substrate to the tip of the inserted stud (pillar).

3. The method according to claim 1, wherein the step of forming the layers of the optical waveguide on top of the electrical substrate, covering the portion plated with solder, is performed by forming a laminated optical waveguide (having a core interposed between an underclad layer and an overclad layer) on top of the electrical substrate.

4. The method according to claim 3, wherein the laminated optical waveguide is configured so the layers of the optical waveguide above the portion plated with solder are removed beforehand, and the portion plated with solder remains exposed during lamination.

5. The method according to claim 1, wherein the step of forming the layers of the optical waveguide on top of the electrical substrate, covering the portion plated with solder, is performed by laminating a photocurable resin.

\* \* \* \* \*